US008143963B2

(12) United States Patent
Lin et al.

(10) Patent No.: US 8,143,963 B2

(45) Date of Patent: Mar. 27, 2012

(54) VOLTAGE SOURCE CIRCUIT FOR CRYSTAL OSCILLATION CIRCUIT

(75) Inventors: Yung-Ching Lin, Hsinchu County (TW); Chia-Chun Hsu, Taipei County (TW)

(73) Assignee: eMemory Technology Inc., Hsinchu (TW)

( * ) Notice: Subject to any disclaimer, the term of this patent is extended or adjusted under 35 U.S.C. 154(b) by 135 days.

(21) Appl. No.: 12/795,661

(22) Filed: Jun. 8, 2010

(65) Prior Publication Data

US 2011/0298556 A1 Dec. 8, 2011

(51) Int. Cl.

*H03B 5/36* (2006.01)
*H03L 1/00* (2006.01)
*H03L 1/02* (2006.01)

(52) U.S. Cl. .................. 331/186; 331/116 FE; 331/158; 331/159; 331/176

(58) Field of Classification Search .................... 331/65, 331/66, 116 R, 116 FE, 116 M, 158, 159, 331/175, 176, 185, 186

See application file for complete search history.

(56) References Cited

U.S. PATENT DOCUMENTS 4,064,468 A 12/1977 Kumata
4,441,825 A * 4/1984 Morokawa .................... 368/204
5,113,156 A 5/1992 Mahabadi et al.
5,481,229 A 1/1996 Connell et al.
5,486,795 A 1/1996 Spence et al.

* cited by examiner

*Primary Examiner* — David Mis

(74) *Attorney, Agent, or Firm* — Jianq Chyun IP Office

(57) ABSTRACT

A voltage source circuit for a crystal oscillation circuit is provided, in which the voltage source circuit and the crystal oscillation circuit are formed with the same process. The voltage source circuit includes a current source, a first PMOS, a first NMOS and a regulator unit. The current source is coupled between a voltage source and an output terminal, in which the output terminal outputs a reference voltage. Both of the gates and drains of the first PMOS and the NMOS are coupled to each other, and the first PMOS and the first NMOS are coupled between the output terminal and a ground. The regulator unit generates a work voltage to the crystal oscillation circuit as a voltage source of the crystal oscillation circuit according to the reference voltage.

28 Claims, 8 Drawing Sheets

VDD I1 OUT Q1 Cd GND M1 GND A1 VDD Q2 R1 R2 GND 100 104 Q3 XTALout M2 R3 GND XTAL C1 C2 GND GND 102

VOLTAGE SOURCE CIRCUIT FOR CRYSTAL OSCILLATION CIRCUIT

BACKGROUND OF THE INVENTION

1. Field of the Invention

The invention generally relates to a voltage source circuit, and more particularly, to a self-adjustment voltage source circuit for a crystal oscillation circuit.

2. Description of Related Art

An oscillator is frequently used in semiconductor technologies as a timing module, a logic gate, and an oscillator chip, etc. A conventional oscillator includes a quartz crystal attached to a pair of capacitors having an initial resistor. The RC circuit formed by the capacitors and resistors can help adjust a timing of the oscillator. An oscillator buffer and the quartz crystal are parallel-connected. By generating an amplified and inverted signal, the conventional oscillator buffer operates like an inverter. The quartz oscillator, the RC circuit, and the oscillator buffer provides a predetermined waveform at a predetermined frequency.

The power dissipation of the oscillator may be determined by an operating frequency, a capacitor, and a work voltage of the oscillator buffer. Typically speaking, the power of the oscillator needs to be maintained at a small value. Since the pre-set operating frequency and the capacitance of the capacitor are fixed, thus to decrease power dissipation, the operating voltage of the oscillator buffer may be considered. Due to the signal bandwidth of the oscillator buffer, the amplifying gain varies with changes of the operating voltages, the process parameters, and the capacitors. However, in many practical applications, this gain variation frequently results in a long oscillation trigger time, or the crystal oscillation circuit may even fail to oscillate. Therefore, to ensure the oscillator operates normally, the work voltage of the oscillator buffer is set at a higher value to accommodate process variation, although this setting may cause unnecessary power dissipation at normal circumstance.

SUMMARY OF THE INVENTION

An aspect of the invention provides a voltage source circuit for a crystal oscillation circuit that is capable of maintaining constant power dissipation of the crystal oscillation circuit.

The invention is directed to a voltage source circuit adapted to provide a work voltage to the crystal oscillation circuit, in which the voltage source circuit and the crystal oscillation circuit are formed with a same process. The voltage source circuit includes a current source, a first P-type transistor, a first N-type transistor, and a regulator unit. The current source is coupled between a voltage source and an output terminal. The first P-type transistor has a source coupled to the output terminal, a gate and a drain coupled to each other, in which the output terminal outputs a reference voltage to regulator. The first N-type transistor has a gate and a drain coupled to the drain of the first P-type transistor, and a source coupled to a ground. The regulator unit is coupled between the output terminal and the crystal oscillation circuit, and the regulator unit is configured to generate the work voltage to the crystal oscillation circuit as a voltage source in accordance with the reference voltage.

An aspect of the invention provides a voltage source circuit adapted to provide a work voltage to the crystal oscillation circuit, in which the voltage source circuit and the crystal oscillation circuit are formed with a same process. The voltage source circuit includes a current source, a first voltage drop unit, a first P-type transistor, a first N-type transistor, a second voltage drop unit, and a regulator unit. The current source is coupled between a voltage source and an output terminal. The first voltage drop unit has an end coupled to the output terminal, in which the output terminal outputs a reference voltage. The first P-type transistor has a source coupled to another end of the first voltage drop unit, and a gate and a drain coupled to each other. The first N-type transistor has a gate and a drain coupled to the drain of the first P-type transistor. The second voltage drop unit is coupled between the source of the first N-type transistor and the ground. The regulator unit is coupled between the output terminal and the crystal oscillation circuit, and the regulator unit is configured to generate the work voltage to the crystal oscillation circuit as a voltage source in accordance with the reference voltage.

An aspect of the invention provides a voltage source circuit adapted to provide a work voltage to the crystal oscillation circuit, in which the voltage source circuit and the crystal oscillation circuit are formed with a same process. The voltage source circuit includes a current source, a first P-type transistor, a first N-type transistor, and a regulator unit. The current source is coupled between a voltage source and an output terminal. The first N-type transistor has a drain coupled to the output terminal, and a gate and the drain coupled to each other, in which the output terminal outputs a reference voltage. The first P-type transistor has a gate and a drain coupled to each other, a source coupled to the source of the first N-type transistor, and a drain coupled to the ground. The regulator unit is coupled between the output terminal and the crystal oscillation circuit, and the regulator unit is configured to generate the work voltage to the crystal oscillation circuit as a voltage source in accordance with the reference voltage.

An aspect of the invention provides a voltage source circuit adapted to provide a work voltage to the crystal oscillation circuit, in which the voltage source circuit and the crystal oscillation circuit are formed with a same process. The voltage source circuit includes a current source, a voltage drop unit, a first P-type transistor, a first N-type transistor, a second voltage drop unit, and a regulator unit. The current source is coupled between a voltage source and an output terminal. The first voltage drop unit has an end coupled to the output terminal, in which the output terminal outputs a reference voltage. The first N-type transistor has a drain coupled to another end of the first voltage drop unit, and a gate and the drain of the first N-type transistor are coupled to each other. The first P-type transistor has a gate and a drain coupled to each other, and a source coupled to the source of the first N-type transistor. The second voltage drop unit is coupled between the drain of the first P-type transistor and the ground. The regulator unit is coupled between the output terminal and the crystal oscillation circuit, and the regulator unit is configured to generate the work voltage to the crystal oscillation circuit as a voltage source in accordance with the reference voltage.

In summary, an embodiment of the invention employs threshold values of transistors that vary according to process condition changes to control the work voltage of the P-type transistor and the N-type transistor, so that the power dissipation of the crystal oscillation circuit may be less fluctuated.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
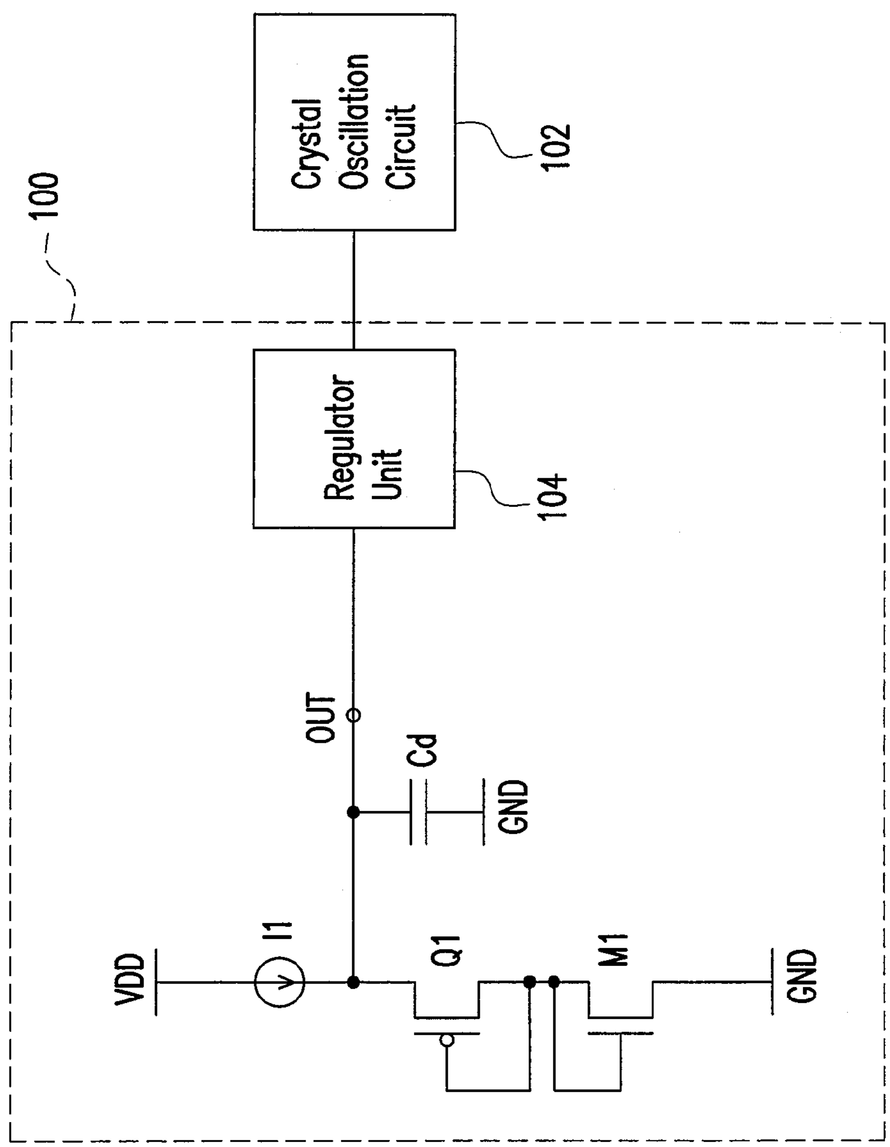
FIG. 1 is a block diagram of a voltage source circuit and a crystal oscillation circuit in accordance with an embodiment of the invention.

FIG. 1 is a block diagram of a voltage source circuit and a crystal oscillation circuit in accordance with an embodiment of the invention. Referring to FIG. 1, a voltage source circuit 100 and a crystal oscillation circuit 102 are formed with a same process. The voltage source circuit 100 may include a current source I1, a P-type transistor Q1, a N-type transistor M1, a stabilizing capacitor Cd, and a regulator unit 104. The P-type transistor Q1 may be a P-channel metal-oxide-semiconductor field effect (PMOS) transistor, for example. The N-type transistor M1 may be a N-channel metal-oxide-semiconductor field effect (NMOS) transistor, for example. The current source I1 may be a current source proportional to absolute temperature current source or a complementary to absolute temperature current source. The aforesaid current source I1 is coupled between a voltage source VDD and an output terminal OUT. The P-type transistor Q1 has a source coupled to the output terminal, and a gate of the P-type transistor Q1 is coupled to a drain thereof. The N-type transistor M1 has a gate and a drain coupled to the drain of the P-type transistor Q1, and a source coupled to a ground GND. The stabilizing capacitor Cd is coupled between the output terminal OUT and the ground GND. Moreover, the regulator unit 104 is coupled between the output terminal OUT and the crystal oscillation circuit 102.

A voltage drop on the P-type transistor Q1 and the N-type transistor M1 generates a reference voltage on the output terminal OUT. The regulator unit 104 stabilizes the reference voltage, so as to generate a work voltage to the crystal oscillation circuit 102 to serve as a voltage source of the crystal oscillation circuit 102. The P-type transistor Q1 and the N-type transistor M1 in the present embodiment may be substantially equivalent to a diode device, and the coupling position of the P-type transistor Q1 and the N-type transistor M1 may be interchanged. In other words, the terminal coupled to the current source I1 may be coupled to the P-type transistor Q1 or the N-type transistor M1, and correspondingly the N-type transistor M1 or the P-type transistor Q1 is coupled to the ground GND. According to different manufacturing conditions, the voltage source circuit 100 may output a corresponding work voltage to the crystal oscillation circuit 102, so as to reduce power dissipation of the crystal oscillation circuit 102. Furthermore, the type of current source adopted (e.g., a proportional to absolute temperature current source or a complementary to absolute temperature current source) may perform temperature compensation on the crystal oscillation circuit 102, so that the crystal oscillation circuit 102 may be more efficiently applied.

Figure 2:
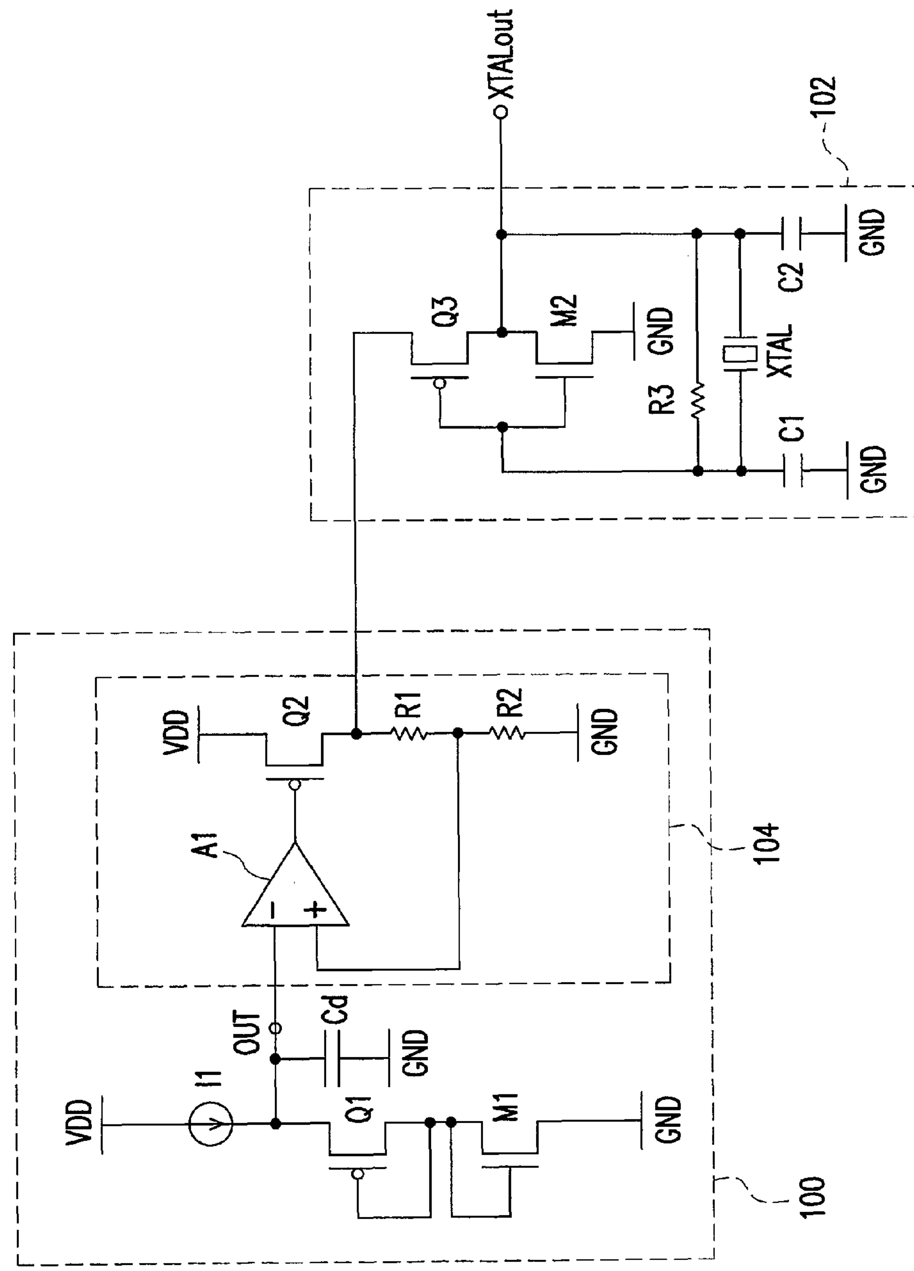
FIG. 2 is a circuit diagram of a voltage source circuit and a crystal oscillation circuit in accordance with another embodiment of the invention.

FIG. 2 is a circuit diagram of a voltage source circuit and a crystal oscillation circuit in accordance with another embodiment of the invention. Referring to FIG. 2, the regulator unit 104 may include an operational amplifier A1, a P-type transistor Q2, a resistor R1, and a resistor R2. The P-type transistor Q2 has a gate coupled to an output terminal of the operational amplifier A1, a source coupled to the voltage source VDD, and a drain coupled to the crystal oscillation circuit 102. The resistors R1 and R2 are serially connected together between the drain of the P-type transistor Q2 and the ground GND. A common connection point of the resistors R1 and R2 is coupled to a positive input end of the operational amplifier A1, and a negative input end of the operational amplifier A1 is coupled to the output terminal OUT. It should be noted that the regulator unit 104 in the present embodiment is for the purposes of illustration only and should not be regarded as limiting. Any circuit that can stabilize the reference voltage can serve as the regulator unit 104 in the present embodiment.

Moreover, the crystal oscillation circuit 102 includes a P-type transistor Q3, a N-type transistor M2, a resistor M3, a crystal XTAL, a capacitor C1, and a capacitor C2. The P-type transistor Q3 has a source coupled to the regulator unit 104 for receiving the work voltage provided by the regulator unit 104, a drain coupled to an output terminal XTALout of the crystal oscillation circuit 102, and a gate coupled to the gate of the N-type transistor M2. The N-type transistor M2 has a drain and a source coupled to the drain of the P-type transistor and the ground GND, respectively. The resistor R3 and the crystal XTAL are connected in parallel to an inverter formed by the P-type transistor Q3 and the N-type transistor M2 (i.e., the resistor R3 and the crystal XTAL are connected in parallel between the gate and the drain of the N-type transistor M2). The capacitors C1 and C2 are respectively coupled between the two ends of the crystal XTAL and the ground GND. The capacitors C1 and C2 provide a load to the quartz crystal XTAL needed for parallel resonance.

As shown in a circuit depicted in FIG. 2, the power dissipated by the transistors Q3 and M2 is correlated with a current size flowing through the transistors, or by a size of transconductance of the transistors Q3 and M2. A current of the transistors Q3 and M2 while in the saturation region may be represented by the following formula:

$$I=k(Vgs-Vt)^2 \tag{1}$$

in which i represents a current, k represents a constant, Vgs represents a voltage difference between the gate and the source, and Vt represents a transistor threshold voltage. Moreover, a transconductance Gm of the transistors Q3 and M2 may be derived by differentiating formula (1):

$$Gm = \frac{\partial I}{\partial Vgs} = 2k(Vgs - Vt) \tag{2}$$

As shown in formula (1), when the threshold voltage of the transistors increase, the transconductance of the transistors and the current flowing through the transistors decrease. That is, the smaller the transconductance Gm of the transistors and the current flowing through the transistors, the smaller the power dissipation of the transistors.

Since different threshold voltage values are generated by the transistors under different process conditions, such as a FF corner or a SS corner process condition, the threshold voltage values may be increased or decreased according to these varying manufacturing conditions. Assuming the same operating voltage values, when the threshold voltage value decreases (i.e., the FF corner process condition), the transconductance of the transistors and the current flowing through the transistors increase, and the power dissipated by the transistors increases. Conversely, when the threshold voltage value increases (i.e., the SS corner process condition), the transconductance of the transistors and the current flowing through the transistors decrease, and the power dissipated by the transistors decreases.

In the present embodiment of the invention, the voltage source of the transistors Q3 and M2 is produced by a sum of the voltage drop values of the transistors Q1 and M1 (i.e., the reference voltage on the output terminal OUT), as well as the work voltage stabilized and amplified by the regulator unit 104. Since the transistors Q1 and M1 and the transistors Q3 and M2 are formed with the same process, therefore when process parameters change, the transistors Q1 and M1 are affected and produce the same variation in threshold voltage values. Accordingly, the transistors Q1 and M1 may indirectly influence the work voltage of the crystal oscillation circuit 102 provided by the regulator unit 104, and thereby prevent unnecessary power dissipation.

For example, under the FF corner process condition, the threshold voltages of the transistors Q3 and M2 decrease, thereby narrowing the threshold to turn on the transistors Q3 and M2. Hence, when operating under the same work voltages, the power dissipation of the transistors Q3 and M2 increases. Moreover, since the transistors Q1 and M1 are also affected by the FF corner process condition, the voltage drops on the transistors Q1 and M1 are reduced. Consequently, the reference voltage on the output terminal OUT also decreases (i.e., the sum of the voltage drop values on the transistors Q1 and M1). Concurrently, the regulator unit 104 reduces the operating voltage that has been stabilized and amplified. Since the threshold voltages of the transistors Q3 and M2 are affected by the FF corner process condition and reduced, the work voltage provided to the transistors Q3 and M2 are also accordingly decreased. Under this circumstance, although the work voltage provided by the regulator unit 104 is reduced, the reduced work voltage may still be able to maintain normal operation of the transistors Q3 and M2. Moreover, the reduced work voltage may decrease the voltage difference between the gate and the source, and reduce the transistor transconductance and the current flowing through the transistors Q3 and M2, thereby reducing the power dissipation of the transistors Q3 and M2.

Figure 3A:
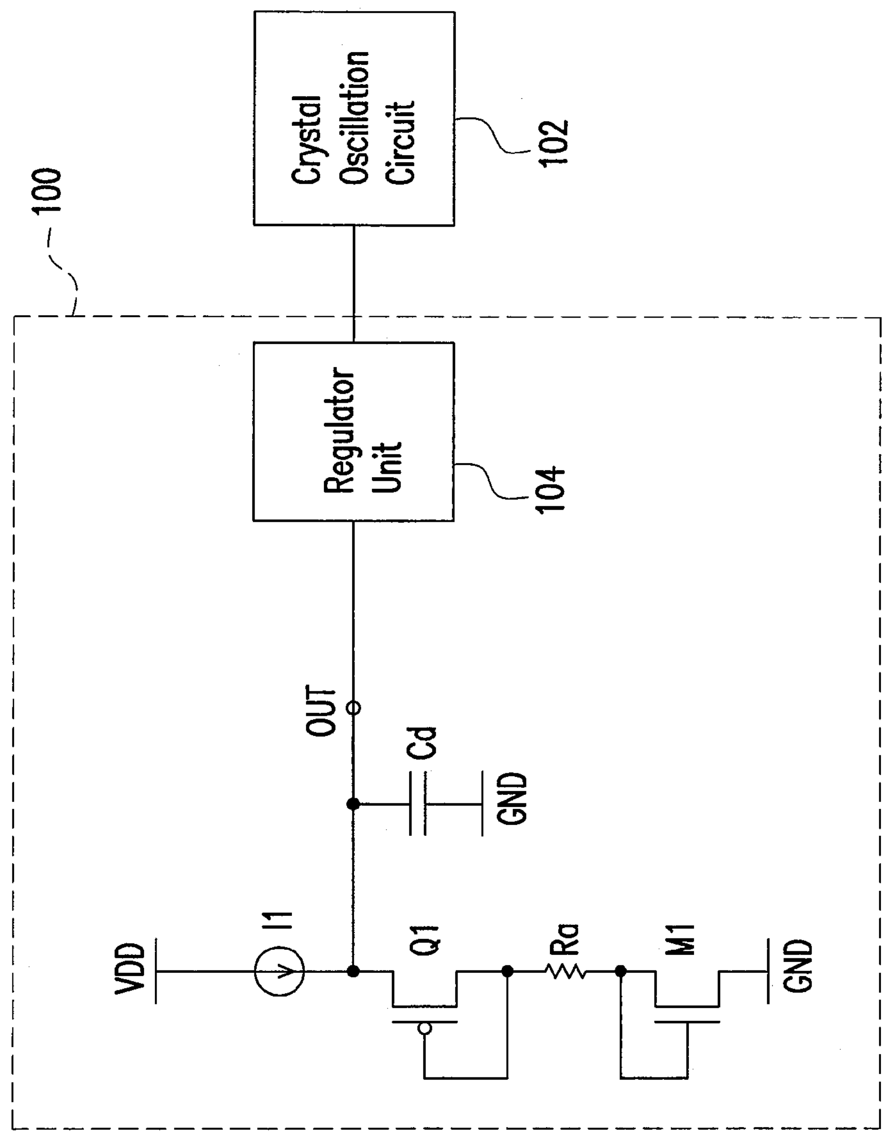
FIG. 3A~FIG. 3C are circuit diagrams of a voltage source circuit and a crystal oscillation circuit in accordance with another embodiment of the invention.
Figure 3B:
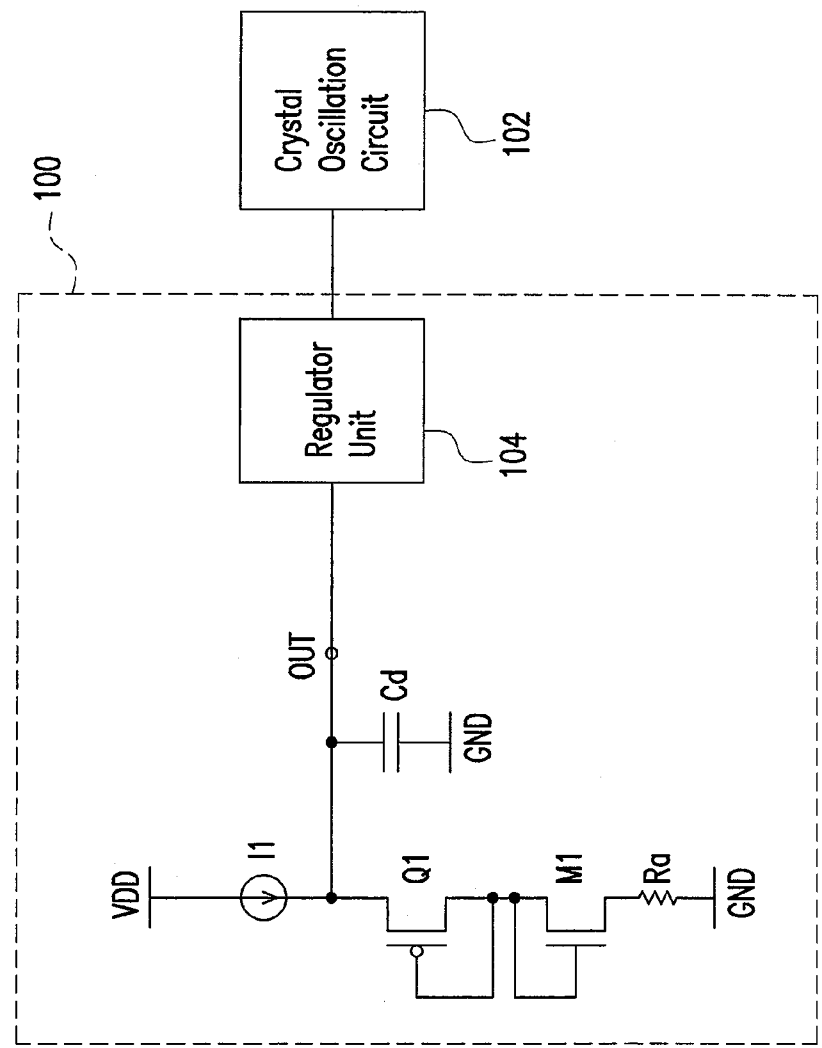
Figure 3C:
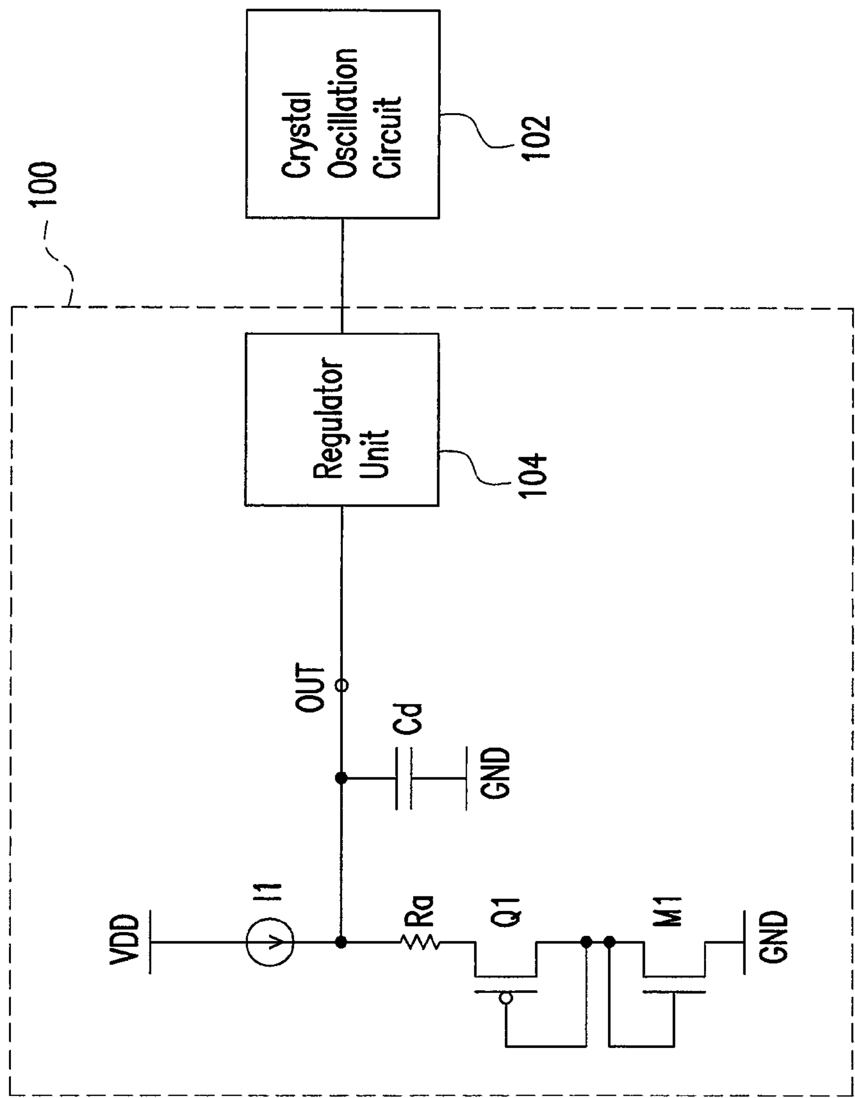

It is noted that, In other embodiments of the invention, the voltage source circuit 100 of FIG. 1 and FIG. 2 further includes a regulating resistor. FIG. 3A~FIG. 3C are circuit diagrams of a voltage source circuit and a crystal oscillation circuit in accordance with another embodiment of the invention. The stabilizing capacitor Cd is coupled between the output terminal OUT and the ground GND. The regulating resistor Ra is set at the coupling path between the transistor Q1 and the transistor M1, or the coupling path between the transistor M1 and the ground GND, or the coupling path between the ground GND and the transistor Q1. Wherein the regulating resistor Ra is a positive temperature coefficient resistor or a negative temperature coefficient resistor. By choosing the appropriate type of resistance to perform temperature compensation on the crystal oscillation circuit 102, so that the crystal oscillation circuit 102 may be more efficiently applied.

Figures 4A, 4B:
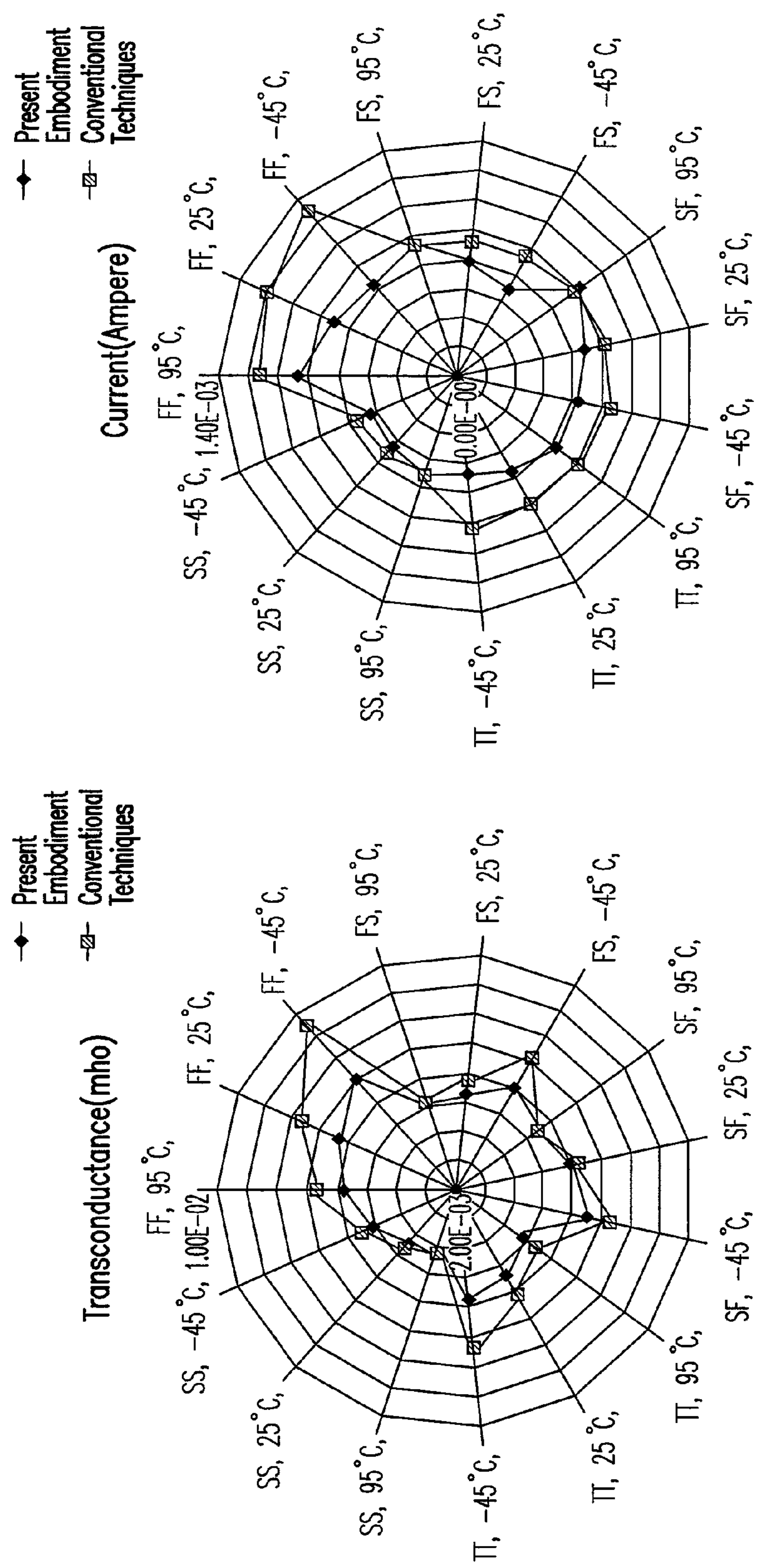
FIG. 4A is a schematic diagram of a transistor current value under different process conditions.
FIG. 4B is a schematic diagram of a transistor transconductance value under different process conditions.

FIG. 4A is a schematic diagram of a transistor current value under different process conditions. FIG. 4B is a schematic diagram of a transistor transconductance value under different process conditions. Referring to FIGS. 4A and 4B, FIG. 4A illustrates a plurality of current sizes of a transistor under different process conditions and temperatures, whereas FIG. 4B illustrates a plurality of transconductance sizes of a transistor under different process conditions and temperatures. As shown in FIGS. 4A and 4B, compared to conventional crystal oscillation circuits, the voltage source circuit 100 utilizing the present embodiment of the invention may drastically reduce the transconductance values and the current values under different process conditions and temperatures. In particular, under the process condition of FF corner and −45° C., the current value may be reduced by half, and the transconductance value may also be reduced by 0.3 times. Moreover, under all of the process conditions and temperatures, even when the transconductance value and the current value are at the smallest (i.e., the process condition of SS corner and −95° C.), adopting the techniques of the present embodiment still maintains the same transconductance value and the current value of the conventional crystal oscillation circuit. Therefore, even when the transistor threshold voltages are at their largest, the techniques disclosed by the present embodiment of the invention may still successfully maintain normal operation of the crystal oscillation circuit 102. Hence, while maintaining normal operation of the crystal oscillation circuit 102, the techniques disclosed by the present embodiment may reduce the transconductance value and current value of the transistors, and thereby preserve the power dissipation of the crystal oscillation circuit 102.

Figure 5:
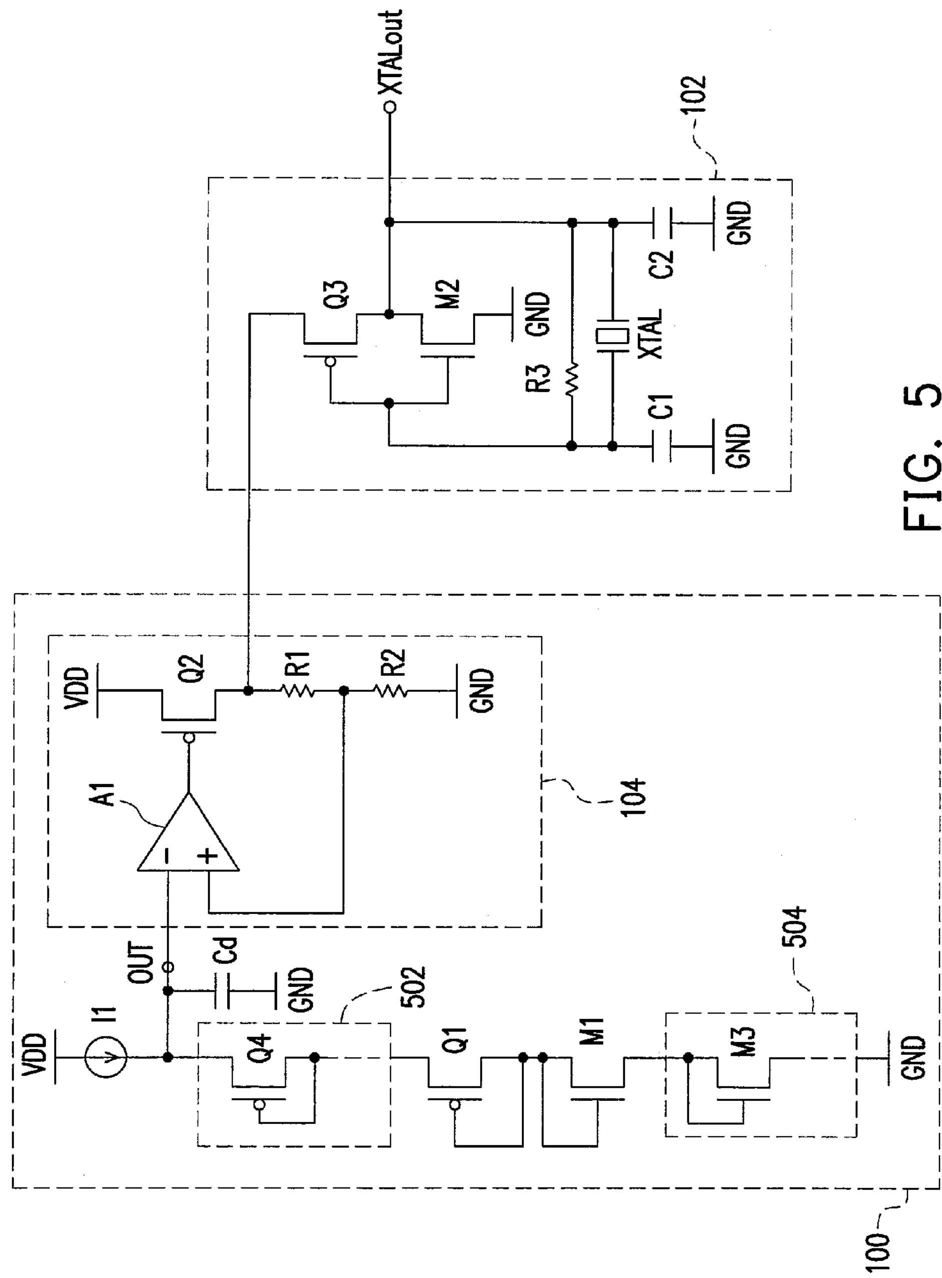
FIG. 5 is a circuit diagram of a voltage source circuit and a crystal oscillation circuit in accordance with another embodiment of the invention.

In other embodiments of the invention, a number of transistors depicted in FIG. 2 as coupled to the current source I1 may not be limited to the transistors Q1 and M1. FIG. 5 is a circuit diagram of a voltage source circuit and a crystal oscillation circuit in accordance with another embodiment of the invention. Referring to FIG. 5, a difference between a voltage source circuit 500 and the voltage source circuit 100 of FIG. 2 is that, the voltage source circuit 500 of the present embodiment further includes a voltage drop unit 502 and a voltage drop unit 504. The voltage drop unit 502 is coupled between the output terminal OUT and the source of the P-type transistor Q1, whereas the voltage drop unit 504 is coupled between the source of the N-type transistor M1 and the ground GND. The voltage drop unit 502 includes at least a P-type transistor Q4 coupled in series between the current source I1 and the P-type transistor Q1, and the P-type transistor Q4 has a gate and a source coupled to each other. Likewise, the voltage drop unit 504 includes at least a N-type transistor M3 coupled in series between the N-type transistor M1 and the ground GND, and the N-type transistor Q4 has a gate and a drain coupled to each other.

By adjusting the number of transistors in the voltage drop units 502 and 504 according to practical circumstances, a user may determine a varying magnitude of the work voltage provided by the voltage source circuit 500 under different process conditions, thereby minimizing the power dissipation of the crystal oscillation circuit 102. As the operation principles of the voltage source circuit 500 and the crystal oscillation circuit 102 in the present embodiment are similar to those of the voltage source circuit 100 and the crystal oscillation circuit 102 depicted in FIG. 2, persons having ordinary knowledge in the art may derive the device operations in the present embodiment by using the embodiment illustrated in FIG. 2, hence further description thereof is omitted.

Figure 6:
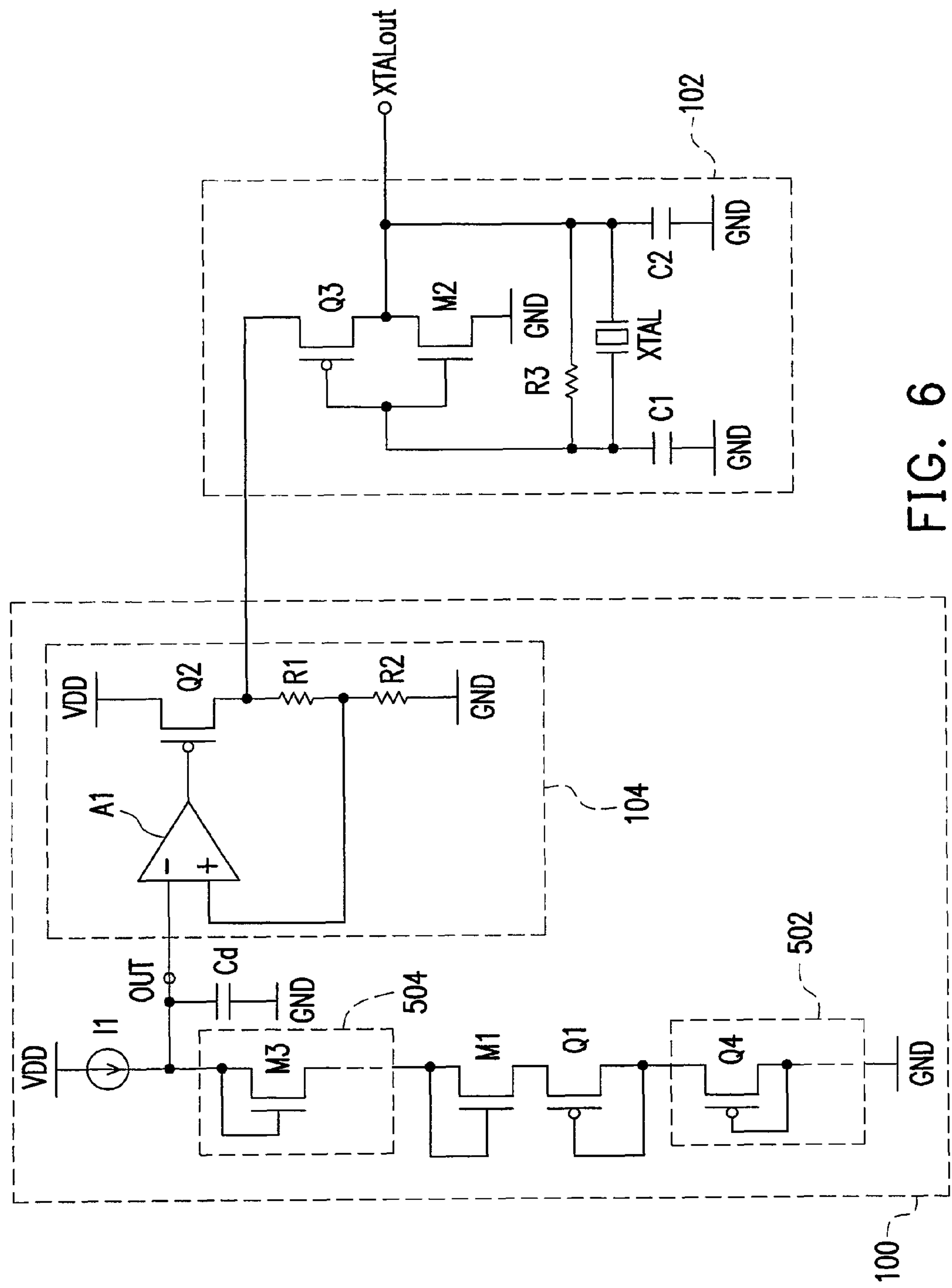
FIG. 6 is a circuit diagram of a voltage source circuit and a crystal oscillation circuit in accordance with another embodiment of the invention.

In another embodiment of the invention, the P-type transistor Q1 and the voltage drop unit 502 depicted in FIG. 5 may be respectively interchanged with the N-type transistor M1 and the voltage drop unit 504. FIG. 6 is a circuit diagram of a voltage source circuit and a crystal oscillation circuit in accordance with another embodiment of the invention. As shown in FIG. 6, the voltage drop unit 504 in a voltage source circuit 600 is coupled between the output terminal OUT and the drain of the N-type transistor M1. The source of the N-type transistor M1 is coupled to the source of the P-type transistor Q1, the drain of the P-type transistor Q1 is coupled to the voltage drop unit 502, and another terminal of the voltage drop unit 502 is coupled to the ground GND. As the operation principles of the voltage source circuit 600 and the crystal oscillation circuit 102 in the present embodiment are similar to those of the voltage source circuit 100 and the crystal oscillation circuit 102 depicted in FIG. 2, further description thereof is omitted. In addition, the circuit structure consisted of the voltage drop unit 502, the voltage drop unit 504, the transistors Q1 and transistors M1 of the FIG. 5 and the FIG. 6 could be replaced by the circuit structure consisted of the regulating resistor Ra, the transistors Q1 and transistors M1 of the FIG. 3A~FIG. 3C to perform temperature compensation on the crystal oscillation circuit 102, so that the crystal oscillation circuit 102 may be more efficiently applied.

In light of the foregoing, embodiments of the invention may employ threshold values of transistors that vary according to process condition changes to control the work voltage of the P-type transistor and the N-type transistor, so that the transconductance value and the current value of the transistors may be reduced, and the power dissipation of the crystal oscillation circuit may be minimized. Moreover, by adopting a proportional to absolute temperature current source or a complementary to absolute temperature current source, and choosing a positive temperature coefficient resistor or a negative temperature coefficient resistor as the regulating resistor, such a current source may perform temperature compensation on the crystal oscillation circuit.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A voltage source circuit adapted to provide a work voltage to a crystal oscillation circuit, wherein the voltage source circuit and the crystal oscillation circuit are formed with a same process, the voltage source circuit comprising:

a current source coupled between a voltage source and an output terminal;

a first P-type transistor having a source coupled to the output terminal, and a gate and a drain coupled to each other, wherein the output terminal outputs a reference voltage;

a first N-type transistor having a gate and a drain coupled to the drain of the first P-type transistor, and a source coupled to a ground; and a regulator unit coupled between the output terminal and the crystal oscillation circuit, configured to generate the work voltage to the crystal oscillation circuit as a voltage source of the crystal oscillation circuit in accordance with the reference voltage.

2. The voltage source circuit as claimed in claim 1, wherein the voltage source is a proportional to absolute temperature current source or a complementary to absolute temperature current source.

3. The voltage source circuit as claimed in claim 1, further includes a regulating resistor, the regulating resistor is set at the coupling path between the source of the first P-type transistor and the output terminal, wherein the regulating resistor is a positive temperature coefficient resistor or a negative temperature coefficient resistor.

4. The voltage source circuit as claimed in claim 1, further includes a regulating resistor, the regulating resistor is set at the coupling path between the drain of the first P-type transistor and the drain of the first N-type transistor, wherein the regulating resistor is a positive temperature coefficient resistor or a negative temperature coefficient resistor.

5. The voltage source circuit as claimed in claim 1, further includes a regulating resistor, the regulating resistor is set at the coupling path between the source of the first N-type transistor and the ground, wherein the regulating resistor is a positive temperature coefficient resistor or a negative temperature coefficient resistor.

6. The voltage source circuit as claimed in claim 1, wherein the regulator unit comprises:

an operational amplifier having a negative input end coupled to the output terminal;

a second P-type transistor having a gate coupled to an output terminal of the operational amplifier, a source coupled to the voltage source, and a drain coupled to the crystal oscillation circuit;

a first resistor coupled between the drain of the second P-type transistor and the positive input end of the operational amplifier; and a second resistor coupled between the positive input end of the operational amplifier and the ground.

7. The voltage source circuit as claimed in claim 6, wherein the crystal oscillation circuit comprises:

a third P-type transistor having a source coupled to the regulator unit;

a second N-type transistor having a gate coupled to the gate of the third P-type transistor, a drain coupled to the drain of the third P-type transistor, and a source coupled to the ground;

a third resistor connected in parallel with a crystal between the gate and the drain of the second N-type transistor;

a first capacitor coupled between a first end of the crystal and the ground; and a second capacitor coupled between a second end of the crystal and the ground.

8. The voltage source circuit as claimed in claim 7, wherein the first through third P-type transistors are P-channel metal-oxide-semiconductor field effect (PMOS) transistors, and the first through fourth N-type transistors are N-channel metal-oxide-semiconductor field effect (NMOS) transistors.

9. A voltage source circuit adapted to provide a work voltage to a crystal oscillation circuit, wherein the voltage source circuit and the crystal oscillation circuit are formed with a same process, the voltage source circuit comprising:

a current source coupled between a voltage source and an output terminal;

a first voltage drop unit having a first end coupled to the output terminal, wherein the output terminal outputs a reference voltage;

a first P-type transistor having a source coupled to another end of the first voltage drop unit, and a gate and a drain coupled to each other;

a first N-type transistor having a gate and a drain coupled to the drain of the first P-type transistor;

a second voltage drop unit coupled to the source of the first N-type transistor and the ground; and a regulator unit coupled between the output terminal and the crystal oscillation circuit, configured to generate the work voltage to the crystal oscillation circuit as a voltage source of the crystal oscillation circuit in accordance with the reference voltage.

10. The voltage source circuit as claimed in claim 9, wherein the first voltage drop unit comprises at least a second P-type transistor coupled in series between the current source and the first P-type transistor, and the second P-type transistor has a gate and a drain coupled to each other.

11. The voltage source circuit as claimed in claim 9, wherein the second voltage drop unit comprises at least a second N-type transistor coupled in series between the first N-type transistor and the ground, and the second N-type transistor has a gate and a drain coupled to each other.

12. The voltage source circuit as claimed in claim 9, wherein the voltage source is a proportional to absolute temperature current source.

13. The voltage source circuit as claimed in claim 9, wherein the voltage source is a complementary to absolute temperature current source.

14. The voltage source circuit as claimed in claim 9, wherein the regulator unit comprises:

an operational amplifier having a negative input end coupled to the output terminal;

a third P-type transistor having a gate coupled to an output terminal of the operational amplifier, a source coupled to the voltage source, and a drain coupled to the crystal oscillation circuit;

a first resistor coupled between the drain of the third P-type transistor and the positive input end of the operational amplifier; and a second resistor coupled between the positive input end of the operational amplifier and the ground.

15. The voltage source circuit as claimed in claim 14, wherein the crystal oscillation circuit comprises:

a fourth P-type transistor having a source coupled to the regulator unit;

a third N-type transistor having a gate coupled to the gate of the third P-type transistor, a drain coupled to the drain of the third P-type transistor, and a source coupled to the ground;

a third resistor connected in parallel with a crystal between the gate and the drain of the third N-type transistor;

a first capacitor coupled between a first end of the crystal and the ground; and a second capacitor coupled between a second end of the crystal and the ground.

16. The voltage source circuit as claimed in claim 15, wherein the first through fourth P-type transistors are PMOS transistors, and the first through third N-type transistors are NMOS transistors.

17. A voltage source circuit adapted to provide a work voltage to a crystal oscillation circuit, wherein the voltage source circuit and the crystal oscillation circuit are formed with a same process, the voltage source circuit comprising:

a current source coupled between a voltage source and an output terminal;

a first N-type transistor having a drain coupled to the output terminal, and a gate and the drain coupled to each other, wherein the output terminal outputs a reference voltage;

a first P-type transistor having a gate and a drain coupled to each other, a source coupled to the source of the first N-type transistor, and a drain coupled to a ground; and a regulator unit coupled between the output terminal and the crystal oscillation circuit, configured to generate the work voltage to the crystal oscillation circuit as a voltage source of the crystal oscillation circuit in accordance with the reference voltage.

18. The voltage source circuit as claimed in claim 17, wherein the voltage source is a proportional to absolute temperature current source or a complementary to absolute temperature current source.

19. The voltage source circuit as claimed in claim 17, wherein the regulator unit comprises:

an operational amplifier having a negative input end coupled to the output terminal;

a second P-type transistor having a gate coupled to an output terminal of the operational amplifier, a source coupled to the voltage source, and a drain coupled to the crystal oscillation circuit;

a first resistor coupled between the drain of the second P-type transistor and the positive input end of the operational amplifier; and a second resistor coupled between the positive input end of the operational amplifier and the ground.

20. The voltage source circuit as claimed in claim 19, wherein the crystal oscillation circuit comprises:

a third P-type transistor having a source coupled to the regulator unit;

a second N-type transistor having a gate coupled to the gate of the third P-type transistor, a drain coupled to the drain of the third P-type transistor, and a source coupled to the ground;

a third resistor connected in parallel with a crystal between the gate and the drain of the second N-type transistor;

a first capacitor coupled between a first end of the crystal and the ground; and a second capacitor coupled between a second end of the crystal and the ground.

21. The voltage source circuit as claimed in claim 20, wherein the first through third P-type transistors are PMOS transistors, and the first through fourth N-type transistors are NMOS transistors.

22. A voltage source circuit adapted to provide a work voltage to a crystal oscillation circuit, wherein the voltage source circuit and the crystal oscillation circuit are formed with a same process, the voltage source circuit comprising:

a current source coupled between a voltage source and an output terminal;

a first voltage drop unit having a first end coupled to the output terminal, wherein the output terminal outputs a reference voltage;

a first N-type transistor having a drain coupled to another end of the first voltage drop unit, and a gate and the drain coupled to each other;

a first P-type transistor having a gate and a drain coupled to each other, and a source coupled to the source of the first N-type transistor;

a second voltage drop unit coupled between the drain of the first P-type transistor and the ground;

a regulator unit coupled between the output terminal and the crystal oscillation circuit, configured to generate the work voltage to the crystal oscillation circuit as a voltage source of the crystal oscillation circuit in accordance with the reference voltage.

23. The voltage source circuit as claimed in claim 22, wherein the first voltage drop unit comprises at least a second N-type transistor coupled in series between the current source and the first N-type transistor, and the second N-type transistor has a gate and a drain coupled to each other.

24. The voltage source circuit as claimed in claim 22, wherein the second voltage drop unit comprises at least a second P-type transistor coupled in series between the first P-type transistor and the ground, and the second P-type transistor has a gate coupled to the drain of the second N-type transistor.

25. The voltage source circuit as claimed in claim 22, wherein the voltage source is a proportional to absolute temperature current source or a complementary to absolute temperature current source.

26. The voltage source circuit as claimed in claim 22, wherein the regulator unit comprises:

an operational amplifier having a negative input end coupled to the output terminal;

a third P-type transistor having a gate coupled to an output terminal of the operational amplifier, a source coupled to the voltage source, and a drain coupled to the crystal oscillation circuit;

a first resistor coupled between the drain of the third P-type transistor and the positive input end of the operational amplifier; and a second resistor coupled between the positive input end of the operational amplifier and the ground.

27. The voltage source circuit as claimed in claim 26, wherein the crystal oscillation circuit comprises:

a fourth P-type transistor having a source coupled to the regulator unit;

a third N-type transistor having a gate coupled to the gate of the third P-type transistor, a drain coupled to the drain of the third P-type transistor, and a source coupled to the ground;

a third resistor connected in parallel with a crystal between the gate and the drain of the third N-type transistor;

a first capacitor coupled between a first end of the crystal and the ground; and a second capacitor coupled between a second end of the crystal and the ground.

28. The voltage source circuit as claimed in claim 27, wherein the first through fourth P-type transistors are PMOS transistors, and the first through third N-type transistors are NMOS transistors.

* * * * *